United States Patent
Priel et al.

(10) Patent No.: US 7,965,119 B2
(45) Date of Patent: Jun. 21, 2011

(54) DEVICE AND METHOD FOR HANDLING METASTABLE SIGNALS

(75) Inventors: Michael Priel, Hertzelia (IL); Dan Kuzmin, Givat Shmuel (IL); Amir Zaltzman, Moshav Amikam (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/304,196

(22) PCT Filed: Jun. 20, 2006

(86) PCT No.: PCT/IB2006/051992
§ 371 (c)(1),
(2), (4) Date: Dec. 10, 2008

(87) PCT Pub. No.: WO2007/148156
PCT Pub. Date: Dec. 27, 2007

(65) Prior Publication Data
US 2009/0174452 A1    Jul. 9, 2009

(51) Int. Cl.
*H03K 3/00* (2006.01)
(52) U.S. Cl. .......................... 327/205; 327/199; 327/202
(58) Field of Classification Search .................. 327/199, 327/202, 205
See application file for complete search history.

(56) References Cited

U.S. PATENT DOCUMENTS

| | | | |
|---|---|---|---|
| 4,745,302 A | 5/1988 | Hanawa et al. | |
| 4,820,939 A | 4/1989 | Sowell et al. | |
| 5,045,801 A | 9/1991 | Mowery | |
| 5,107,137 A * | 4/1992 | Kinugasa et al. | 327/203 |
| 5,754,070 A * | 5/1998 | Baumann et al. | 327/198 |
| 6,002,284 A * | 12/1999 | Hill et al. | 327/202 |
| 6,072,346 A | 6/2000 | Ghahremani | |
| 6,445,235 B1 * | 9/2002 | Sachdev | 327/202 |
| 6,518,810 B1 | 2/2003 | Takahashi | |
| 6,919,875 B2 * | 7/2005 | Abe et al. | 345/100 |
| 2002/0163372 A1 | 11/2002 | Boerstler et al. | |
| 2004/0223386 A1 * | 11/2004 | Mudge et al. | 365/202 |
| 2008/0101513 A1 * | 5/2008 | Zhu et al. | 375/354 |

* cited by examiner

*Primary Examiner* — Lincoln Donovan
*Assistant Examiner* — Ryan C Jager

(57) ABSTRACT

A method and device for managing metastable signals. The device includes: a first latch and a second latch, a multiple switching point circuit, connected between an output node of the first latch and an input node of the second latch, wherein the multiple switching point circuit includes at least one pull up transistor and at least one pull down transistor that are selectively activated in response to a feedback signal provided from the second latch and in response to a an output signal of the first latch such as to define at least a low switching point that is lower than a high switching point of the multiple-switching point circuit; wherein a switching point of an inverter within the first latch is between the high and low switching points.

13 Claims, 4 Drawing Sheets providing a first clock signal to the first latch and providing a second clock signal to the second latch and wherein there is a time gap between a transition of the first clock signal and a transition of the second clock signal.
305 receiving a data signal by a first latch.
310 providing to a multiple switching point circuit, a feedback signal from a second latch and a first output signal from the first latch.
320 outputting a definite output signal from the multiple switching point circuit in response to the feedback signal and to the first output signal. The feedback signal and the first output signal selectively activate at least one pull up transistor and at least one pull down transistor that define at least a low switching point that is lower than a high switching point of the multiple switching point circuit; wherein a switching point of an inverter is between the high and low switching points.
340

DEVICE AND METHOD FOR HANDLING METASTABLE SIGNALS

FIELD OF THE INVENTION

The present invention relates to devices and methods for handling metastable signals.

BACKGROUND OF THE INVENTION

Synchronized devices sample or receive data by sampling the data at sampling points that are usually defined by a clock signal. In order to sample the data correctly timing constraints (such as setup period and hold period) are imposed. These timing constraints define the timing difference between data signal transitions and clock signal transitions. In a nutshell, sampling requires that there is a minimal timing difference between said transitions.

Synchronizers are commonly used for interfacing different circuits that reside into clock domains that are mutually asynchronous. Typically, a synchronizer receives a data signal from an asynchronous circuit that is not clocked at all, but this is not necessarily so. This a-synchronicity complicates the imposition of the mentioned above timing constraints. Accordingly, the synchronizer can sample the data signal while the data signal is not properly defined—it is within a meta-stable range. The synchronizer will eventually converge into a stable position but the convergence period is not indeterminable.

Various methods and devices were suggested for coping with metastability. Some include level sensitive circuits, some include complex circuits that are characterized by a finite and predictable metastable time and some include oscillation suppressors and decentration circuits. The following U.S. patents, all being incorporated herein by reference, illustrates some prior art circuits: U.S. Pat. No. 482,093 of Sowell et al., U.S. Pat. No. 6,072,346 of Ghahremani and U.S. Pat. No. 5,045,801 of Mowery.

There is a need to provide efficient methods and devices for methods handling meta-stable signals.

SUMMARY OF THE PRESENT INVENTION

A device and a method for handling metastable signals, as described in the accompanying claims.

BRIEF DESCRIPTION OF THE DRAWINGS

The present invention will be understood and appreciated more fully from the following detailed description taken in conjunction with the drawings in which:

FIG. 4 is a flow chart of a method for handling meta-stable signals according to an embodiment of the invention.

DETAILED DESCRIPTION OF PREFERRED EMBODIMENTS

Embodiments of the present invention illustrated in the accompanying drawings provide an information processing apparatus such as a mobile phone, a personal data accessory or a media player that includes a device that is capable of managing meta-stable sates.

The device includes a multiple switching point circuit that outputs definite output signals. The multiple switching point circuit can receive a metastable signal but is capable of outputting definite signals. The multiple switching point circuit is connected between a first latch and a second latch and is adapted to receive a feedback signal from the second latch and a first output signal from the first latch. These signals determine which pull up transistors and pull down transistors within the multiple switching point circuit are activates. The activated pull up and pull down transistors force either a low switching point or a high switching point. An inverter within the first latch has a switching point between the high and low switching points of the multiple switching point device. The difference between these switching points enables the multiple point switching circuit to change its output signal from a first definite output signal to another definite output signal after the first latch converges or at least starts to converge to a definite state.

Figure 1:
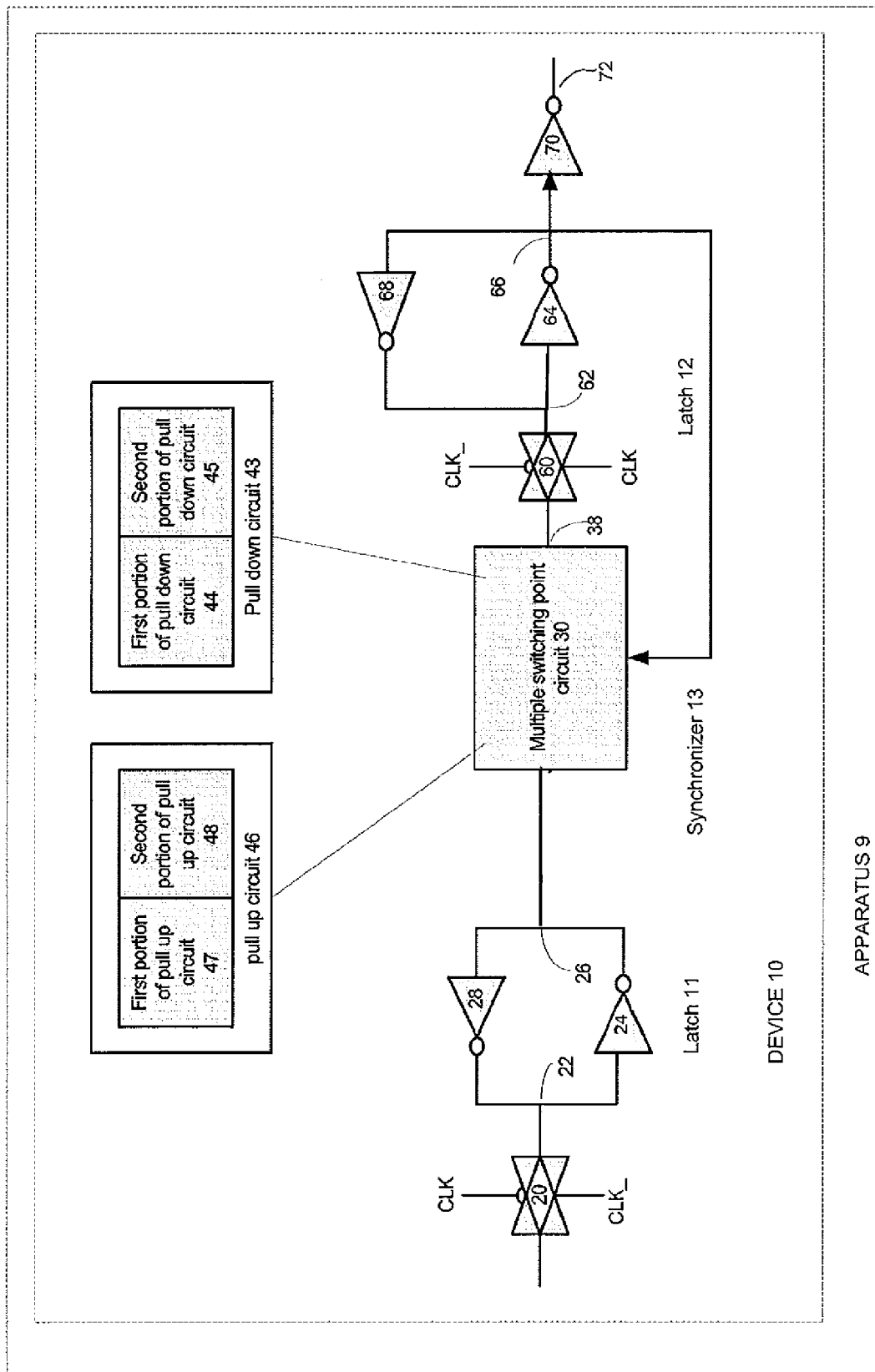
FIG. 1 illustrates an apparatus according to an embodiment of the invention.

FIG. 1 illustrates apparatus 9 according to an embodiment of the invention. Apparatus 9 includes device 10 that in turn may include one or more integrated circuits and may include one or more processors, memory units, DMA controllers and the like. Device 10 can include at least two clock domains that are mutually asynchronous, or can be adapted to receive information from another device, another integrated circuit or another circuit that are mutually asynchronous to device 10.

For simplicity of explanation FIG. 1 illustrates a single synchronizer 13, but device 10 may include many synchronizers. The number of synchronizers depends upon the design of device 10 and especially depends upon the amount of interfaces between mutually asynchronous clock domains.

FIG. 1 illustrates synchronizer 13 that includes 5 first latch 11, second latch 12, first transfer gate 20, second transfer gate 60, output inverter 70 and multiple switching point circuit 30.

First latch 11 includes first inverter 24 and second inverter 28 that are inversely connected to each other such that the input of first inverter 24 is connected to the output of second inverter 28 (at first node 22) while the input of second inverter 28 is connected to the output of first inverter 24 (at second node 26). Second node 26 is an output node of first latch 11 while first node 22 is an input node of first latch 11.

Second node 26 is connected to an input of multiple switching point circuit 30 while the output of multiple switching point circuit 30 is connected to an input of second transfer gate 60. Multiple switching point circuit 30 receives a feedback signal from the output node of second latch 12—from fourth node 66.

The output of second transfer gate 60 is connected to third node 62 that is the input node of second latch 12. Second latch 12 includes third inverter 64 and fourth inverter 68 that are inversely connected to each other such that the input of third inverter 64 is connected to the output of fourth inverter 68 (at third node 62) while the input of fourth inverter 68 is connected to the output of third inverter 64 (at fourth node 66). Fourth node 66 is an output node of second inverter 12 while third node 62 is an input node of second inverter 12.

Second inverter 28 is also referred to as the feedback inverter of first latch 11. Fourth inverter 68 is also referred to as the feedback inverter of second latch 12.

Output node 66 of second latch 12 is connected to inverter 70. The output node 72 of inverter 70 is the output node of synchronizer 13.

First latch 11 samples an input data signal that arrives from a clock domain that is asynchronous to the clock domain of first latch 11. This can cause first latch 11 to sample that data signal while the data signal is not properly defined. Conveniently, the multiple switching point circuit 30 does not propagate not-defined signals to second latch 12.

The multiple switching point circuit 30 is designed such as to change its output signal from one stable value to another stable value only after second inverter 28 of first latch enters a stable state. In other words the multiple switching point circuit 30 switches after second inverter 28 as well as first latch 11 enter a stable state. The margin between the switching points of multiple switching points circuit 30 and the switching point of second inverter 28 enables first latch 11 to converge to a stable state before multiple switching points circuit 30 switches its state.

According to an embodiment of the invention the first transfer gate 20 is activated by a first clock signal (CLK) and a complementary clock signal (CLK_) while the second transfer gate 60 is activated by the complementary clock signal (CLK_) and the first clock signal (CLK) such that the first transfer gate is opened while the second transfer gate is closed and vice versa.

According to another embodiment of the invention the first transfer gate 20 and the second transfer gate 60 receive a first and second clock signals whereas there are time gaps between transitions of the first clock signals and transitions of the second clock signal.

Multiple switching point circuit 30 includes at least one pull up transistor (for example PMOS transistor T6 36 of FIG. 2) and at least one pull down transistor (for example NMOS transistor T5 35 of FIG. 2) that are selectively activated in response to a feedback signal provided from second latch 12 such as to define at least a low switching point that is lower than a high switching point of the multiple-switching point circuit 30. Especially, the low switching point of multiple switching point circuit 30 is lower than the switching point of second inverter 28 while the high switching point of multiple switching point circuit 30 is higher than the switching point of second inverter 28.

FIG. 1 further illustrates that multiple switching point circuit 30 includes pull down circuit 43 and pull up circuit 46. First portion 44 of pull down circuit 43 and first portion 47 of pull up circuit 46 are activated when the feedback signal (from fourth node 66) has a first value. Second portion 45 of pull down circuit 43 and second portion 48 of pull up circuit 46 are activated when the feedback signal (from fourth node 66) has a second value that differs from the first value. Conveniently, the first portion 44 of pull down circuit 43 differs from second portion 45 of pull down circuit 43. First portion 47 of pull up circuit 46 differs from second portion 48 of pull up circuit 46.

Conveniently, the pull up portions include pull up transistors that are connected to a voltage supply while the pull down portions include pull down transistors that are grounded. This is not necessarily so.

The high switching point of the multiple switching point circuit 30 is affected by first portions 47 and 44, whereas first portion 47 of pull up circuit 46 is stronger than first portion 44 of pull down circuit 43. The low switching point of the multiple switching point circuit 30 is affected by second portions 45 and 48, whereas second portion 48 of pull up circuit 46 is weaker than second portion 45 of pull down circuit 43.

The switching point of first latch 11 and especially of feedback inverter 28 (of first latch 11) is positioned between the high and low switching points of multiple switching point circuit 30. Accordingly, when the output signal of first latch 11 starts to rise the high switching point of multiple switching point circuit 30 will cause multiple switching point circuit 30 to switch after feedback inverter 28 switches. When the output signal of first latch 11 starts to fall the low switching point of multiple switching point circuit 30 will cause multiple switching point circuit 30 to switch after feedback inverter 28 switches.

Figure 2:
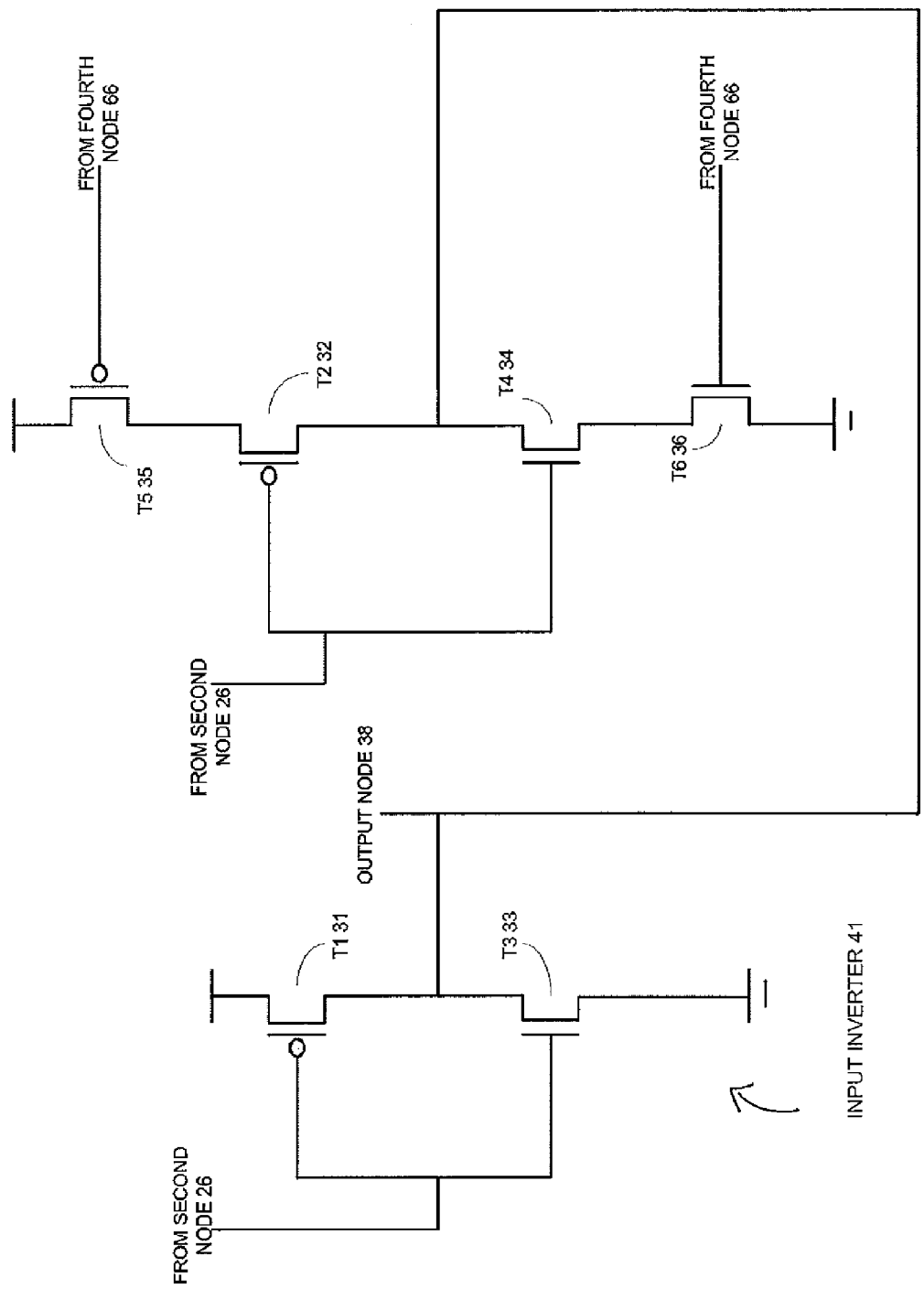
FIG. 2 illustrates a multiple switching point circuit according to an embodiment of the invention.

FIG. 2 illustrates multiple switching point circuit 30 according to an embodiment of the invention.

Multiple switching point circuit 30 includes: (i) pull up transistors such as PMOS transistors T1 31, T2 32 and T5 35, and (ii) pull down transistors such as NMOS transistors T3 33, T4 34 and T6 36.

First transistor T1 31 and third transistor T3 33 form input inverter 41. Input inverter 41 does not receive a feedback signal from fourth node and is activated regardless of the feedback signal. The gates of first transistor T1 31 and third transistor T3 33 are connected to second node 26 and receive the output voltage (V_out_first_latch 26) of first latch 11.

Fifth transistor T5 35, second transistor T2 32, fourth transistor T4 34 and sixth transistor T6 36 form a cascade of transistors 42. The gates of fifth transistor T5 35 and sixth transistor T6 36 are connected to fourth node 66 to receive feedback signal (V_out_second_latch 66) from second latch 12. The gates of second transistor T2 32 and fourth transistor T4 34 are connected to second node 26.

The output node 38 of multiple switching point circuit 30 is connected to the drains of transistors T1 31, T3 33, T2 32 and T4 34.

Assuming an initial state in which V_out_first_latch 26 and V_out_second_latch 66 are low ('0'). At this initial state transistors T1 31, T2 32 and T5 are open while transistors T3 33, T4 34 and T6 36 are closed. Even if V_out_first_latch 26 starts to rise to a level in which pull down transistors T3 33 and T4 34 will start to conduct then pull up transistors T5 35, T1 31 and T2 32 will conduct such as to define a relatively high switching point. This high switching point is higher then the switching points of second inverter 28 and first inverter 24. Accordingly, the switching point of multiple switching point circuit 30 will occur after first latch 11 converges to output a high output signal.

The level of V_out_second_latch 66 will be low only after multiple switching point circuit 30 switches its state and after second latch 12 switches its state accordingly.

Assuming another initial state in which V_out_first_latch 26 and V_out_second_latch 26 are high ('1').

At this initial state transistors T1 31, T2 32 and T5 are closed while transistors T3 33, T4 34 and T6 36 are open. Even if V_out_first_latch 26 starts to fall to a level in which pull up transistors T1 31 and T2 32 will start to conduct then pull down transistors T3 33, T4 34 and T6 36 will conduct such as to define a relatively low switching point. This low switching point is lower then the switching points of second inverter 28 and of first inverter 24. Accordingly, the switching point of multiple switching point circuit 30 will occur after first latch 11 converges to output a low output signal.

The level of V_out_second_latch 26 will be high only after multiple switching point circuit 30 switches its state and after second latch 12 switches its state accordingly.

Figure 3:
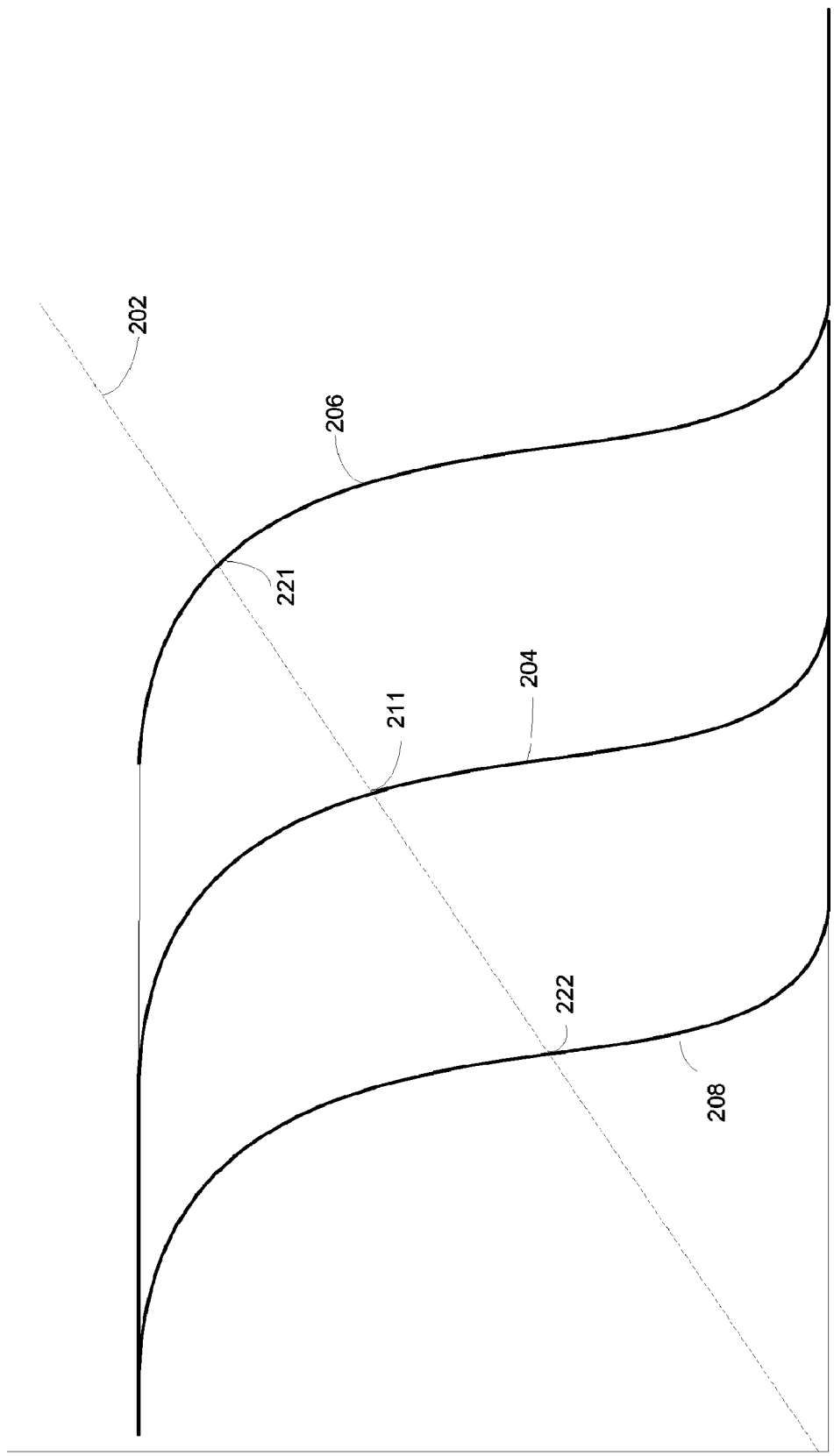
FIG. 3 illustrates a transfer function of a synchronizer and of an inverter within a first latch according to an embodiment of the invention.

FIG. 3 illustrates the transfer function of synchronizer 13 and inverter 28, according to an embodiment of the invention.

Curve 202 illustrates an equilibrium between an input voltage and an output voltage. Curve 204 illustrates the relationship between the input voltage (V_out_first_latch 26) and the output voltage (V_first node 22) of second inverter 28. Curve 202 crosses curve 204 at the switching point (211) of second inverter 28.

Curves 206 and 208 illustrate the relationships between the input voltage (V_out_first_latch 26) and the output voltage (V_out 38) of multiple switching point circuit 30. Curve 206 illustrates the behavior of multiple switching point circuit 30 when V_out_first_latch 26 rises from a low level towards a high level. Curve 208 illustrates the behavior of multiple switching point circuit 30 when V_out_first_latch 26 falls from a high level to a low level. Curve 202 crosses curve 206 at a high switching point (221) of multiple switching point circuit 30. Curve 202 crosses curve 208 at a low switching point (222) of multiple switching point circuit 30.

FIG. 4 is a flow chart of method 300 for managing metastable signals according to an embodiment of the invention.

Method 300 starts by optional stage 305 of providing a first clock signal to the first latch and providing a second clock signal to the second latch and wherein there is a time gap between a transition of the first clock signal and a transition of the second clock signal. It is noted that this is not necessarily so and that both latches can receive complementary clock signals.

Stage 305 is followed by stage 310 of receiving a data signal by a first latch. This data signal can cause the first latch to output a metastable signal.

Stage 310 is followed by stage 320 of providing to a multiple switching point circuit, a feedback signal from a second latch and providing a first output signal from the first latch. It is noted that the first output signal can be a metastable signal.

Conveniently, stage 320 of providing includes providing the feedback signal from an output node of the second latch.

Conveniently, stage 320 of providing is followed by activating a first inverter in response to the first output signal and regardless of the feedback signal.

Stage 320 is followed by stage 340 of outputting a definite output signal from the multiple switching point circuit in response to the feedback signal and to the first output signal. The feedback signal and the first output signal selectively activate at least one pull up transistor and at least one pull down transistor that define at least a low switching point that is lower than a high switching point of the multiple switching point circuit; wherein a switching point of an inverter within the first latch is between the high and low switching points.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A device having metastable signal handling capabilities, the device comprises:
    a pull down circuit and a pull up circuit;
    a first latch including an inverter with a switching point between a high switching point and a low switching point;
    a second latch; and
    a multiple switching point circuit, coupled between an output node of the first latch and an input node of the second latch, wherein the multiple switching point circuit comprises at least one pull up transistor and at least one pull down transistor that are selectively activated in response to a feedback signal provided from the second latch and in response to an output signal of the first latch such as to define at least the low switching point that is lower than the high switching point of the multiple-switching point circuit;
    wherein:
        a first portion of the pull down circuit and a first portion of the pull up circuit are activated when the feedback signal has a first value and wherein a second portion of the pull down circuit and a second portion of the pull up circuit are activated when the feedback signal has a second value that differs from the first value;
    wherein the first portion of the pull down circuit differs from the second portion of the pull down circuit; and
    wherein the first portion of the pull up circuit differs from the second portion of the pull up circuit.

2. The device according to claim 1 wherein an output node of the second latch provides the feedback signal.

3. The device according to claim 2 wherein the multiple switching point circuit further comprises a first inverter that is activated regardless of the feedback signal.

4. The device according to claim 2 wherein the first latch receives a first clock signal and the second latch receives a second clock signal and wherein there is a time gap between a transition of the first clock signal and a transition of the second clock signal.

5. The device according to claim 1 wherein the multiple switching point circuit further comprises a first inverter that is activated regardless of the feedback signal.

6. The device according to claim 1 wherein the first latch receives a first clock signal and the second latch receives a second clock signal and wherein there is a time gap between a transition of the first clock signal and a transition of the second clock signal.

7. The device according to claim 1 wherein the first portion of the pull up circuit is stronger than the first portion of the pull down circuit and wherein the second portion of the pull up circuit is weaker than the second portion of the pull down circuit.

8. The device according to claim 1 wherein a feedback inverter of the first latch switches before the multiple switching point circuit.

9. The device according to any claim 1 wherein the multiple switching point circuit comprises an input inverter coupled to a sequence of transistors that comprises at least two transistors that are selectively activated in response to a level of the feedback signal.

10. The device according to claim 9 wherein the sequence of transistors further comprises at least two transistors that are selectively activated in response to a level of a signal provided from an output node of a first inverter.

11. Information processing apparatus comprising a device according to claim 1.

12. A device having metastable signal handling capabilities, the device comprises:
    a first latch including an inverter with a switching point between a high switching point and a low switching point;
    a second latch; and
    a multiple switching point circuit, coupled between an output node of the first latch and an input node of the second latch, the multiple switching point circuit comprising:
        at least one pull up transistor and at least one pull down transistor that are selectively activated in response to a feedback signal provided from the second latch and in response to an output signal of the first latch such as to define at least the low switching point that is lower than the high switching point of the multiple-switching point circuit; and
        an input inverter coupled to a sequence of transistors that comprises at least two transistors that are selectively activated in response to a level of the feedback signal, wherein the sequence of transistors further comprises at least two transistors that are selectively activated in response to a level of a signal provided from an output node of a first inverter.

13. A device having metastable signal handling capabilities, the device comprises:
   a first latch including an inverter with a switching point between a high switching point and a low switching point,;
   a second latch; and
   a multiple switching point circuit, coupled between an output node of the first latch and an input node of the second latch, the multiple switching point circuit comprising:
      at least one pull up transistor and at least one pull down transistor that are selectively activated in response to a feedback signal provided from the second latch and in response to an output signal of the first latch such as to define at least the low switching point that is lower than the high switching point of the multiple-switching point circuit;
      a pull down circuit; and
      a pull up circuit;
   wherein:
      the first latch receives a first clock signal and the second latch receives a second clock signal and wherein there is a time gap between a transition of the first clock signal and a transition of the second clock signal;
      a first portion of the pull down circuit and a first portion of the pull up circuit are activated when the feedback signal has a first value and wherein a second portion of the pull down circuit and a second portion of the pull up circuit are activated when the feedback signal has a second value that differs from the first value;
      the first portion of the pull down circuit differs from the second portion of the pull down circuit; and
      wherein the first portion of the pull up circuit differs from the second portion of the pull up circuit.

* * * * *